United States Patent [19]
Wang et al.

[11] Patent Number: 5,866,467
[45] Date of Patent: Feb. 2, 1999

[54] METHOD OF IMPROVING OXIDE ISOLATION IN A SEMICONDUCTOR DEVICE

[75] Inventors: Hsingya Arthur Wang, Saratoga; Jein-Chen Young, Milpitas; Nicholas H. Tripsas, San Jose, all of Calif.

[73] Assignee: Advanced Micro Devices, Inc., Sunnyvale, Calif.

[21] Appl. No.: 886,844

[22] Filed: Jul. 1, 1997

Related U.S. Application Data

[63] Continuation of Ser. No. 569,439, Dec. 8, 1995, abandoned.

[51] Int. Cl.$^6$ .................................................. H01L 21/76
[52] U.S. Cl. ........................... 438/444; 438/446; 438/448
[58] Field of Search ..................................... 438/446, 448, 438/229, 230, 232, 444

[56] References Cited

U.S. PATENT DOCUMENTS

| | | | |
|---|---|---|---|
| 5,326,715 | 7/1994 | Jang et al. | 437/69 |
| 5,393,692 | 2/1995 | Wu . | |
| 5,512,509 | 4/1996 | Han | 437/69 |

FOREIGN PATENT DOCUMENTS

| | | |
|---|---|---|
| 3131746A1 | 3/1982 | Germany . |
| 130245 | 2/1989 | Japan . |
| 2304927 | 12/1990 | Japan . |

OTHER PUBLICATIONS

Kenkare, P. et al, "Sensitivity of Field Isolation Profiles to Active Pattern", IEDM, 1993 pp. 479–82.

Roth, S., et al, "Polysilicon Encapsulated Local Oxidation", IEEE Electron Device Letters, vol. 12, No. 3, Mar. 1991, pp. 92–94.

Wolf, S. "Silicon Processing for the LSI Era vol. 3, The Submicron Mosfet", Lattice hess, 1995, pp. 342–344.

Cooper, K., et al, "Recessed Polysilicon Encapsulated Local Oxidation", IEEE Electron Device Letters, vol. 12, No. 10, Oct. 1991, pp. 515–517.

*Primary Examiner*—George R. Fourson
*Attorney, Agent, or Firm*—Skjerven, Morrill, Macpherson, Franklin & Friel LLP; Edward C. Kwok

[57] ABSTRACT

A silicon substrate has patterned thereon a pad oxide layer and a nitride layer. The exposed surface of the silicon substrate is cleaned of residual oxide, and a layer of oxidizable material such as polysilicon is deposit over the resulting structure. The polysilicon layer is anisotropically etched to form spacers on the side of the nitride layer portions, which are also in contact with the silicon substrate, the etching continuing into the silicon substrate. Field oxidation is then undertaken, with the polysilicon spacers being oxidized, as is a portion of the silicon substrate, the spacers causing initial oxidation during field oxide growth to be removed from the sides of the nitride layer portions, so that encroachment of the oxide under the nitride layer portions is avoided.

6 Claims, 3 Drawing Sheets

METHOD OF IMPROVING OXIDE ISOLATION IN A SEMICONDUCTOR DEVICE

This application is a continuation of application Ser. No. 08/569,439, filed Dec. 8, 1995, now abandoned.

FIELD OF THE INVENTION

This invention relates to growth of field oxide regions in a semiconductor device, and more particularly, to a method of such growth wherein stress on a patterned nitride layer used to define such field oxide regions is reduced during such field oxide growth.

BACKGROUND OF THE INVENTION

With reference to FIGS. 1, 2 and 3, a typical method of growing field oxide ($SiO_2$) in a semiconductor device is shown. Initially, a semiconductor substrate 10 (FIG. 2) is provided, and a thin layer of silicon dioxide ($SiO_2$) 12 is grown thereover. A silicon nitride ($Si_3N_4$) layer 14 is patterned over the oxide layer 12 as is well known, resulting in nitride layer portions 14A, 14B shown in cross section in FIG. 2.

These nitride layer portions 14A, 14B may be quite long as shown in FIG. 1, and are used to define regions therebetween in which field oxide will be grown.

The thin oxide layer 12 is then patterned to the configuration of the nitride layer forming oxide layer portions 12A, 12B. This leaves exposed areas 10A of the silicon substrate which will subsequently be oxidized to form field silicon dioxide ($SiO_2$) regions 16A, 16B (FIG. 3).

An important fact for consideration is that during the conversion of silicon to silicon dioxide, the volume of material from original silicon to silicon dioxide is increased by a factor of approximately two. With such field oxide typically being grown at 1100° C., the silicon dioxide has a glass transition temperature at approximately 950° C., so that at 950° C. or greater, the silicon dioxide has a viscous flow. However, even with such viscous flow, the increase in volume as the silicon is converted to silicon dioxide, along with the fact that the silicon dioxide grows rapidly at 1100° C., causes substantial stress to be placed on the edges of the nitride layer portions 14A, 14B as the oxide grows thereunder. That is, a large lifting force is applied to the nitride along the elongated sides thereof, and particularly at the tip thereof where such lifting force is applied on three sides of the nitride layer portion (FIG. 1). With dimensions of semiconductor devices becoming ever smaller, a width of a nitride layer portion 14A may for example be substantially less than 0.5 microns. Because a small area of nitride layer portion is in contact with the underlying oxide, which contact area grows smaller and smaller as the field oxide is grown inward under the nitride layer portion, the force holding the nitride layer portion 14A in place may be reduced to the point where due to the lifting force of the growing field oxide regions, the nitride layer portion 14A lifts away from the thin oxide to form a void 18 thereunder. And, as pointed out above, the faster the field oxide is grown, the less time is allowed for oxide flow to alleviate such stress on the nitride layer portion 14A.

Obviously, creation of such a void in a semiconductor device is undesirable and can lead to device failure.

In addition, with the contact area of the nitride layer portion 14A becoming smaller and smaller as the field oxide 16A, 16B is grown inward under the nitride layer portion 14A, the silicon surface area remaining for incorporation of circuit elements is reduced.

SUMMARY OF THE INVENTION

In accordance with the present invention, a silicon substrate has patterned thereon a pad oxide layer and a nitride layer. The exposed surface of the silicon is cleaned of residual oxide, and a layer of oxidizable material such as polysilicon is deposited over the resulting structure. The polysilicon layer is anisotropically etched to form spacers on the sides of the nitride layer portions, which are also in contact with the silicon substrate, the etching continuing into the silicon substrate, reducing the size of the spacers. Field oxidation is then undertaken, with the polysilicon spacers being oxidized, as is a portion of the silicon substrate.

Encroachment of oxide under the nitride layer portion is avoided since the spacers cause the initial oxidation to take place at points spaced from the sides of the nitride layer portions.

DESCRIPTION OF THE PREFERRED EMBODIMENT

Reference is made to FIGS. 4–8 for the following description of the preferred embodiment of the invention.

Figure 1:
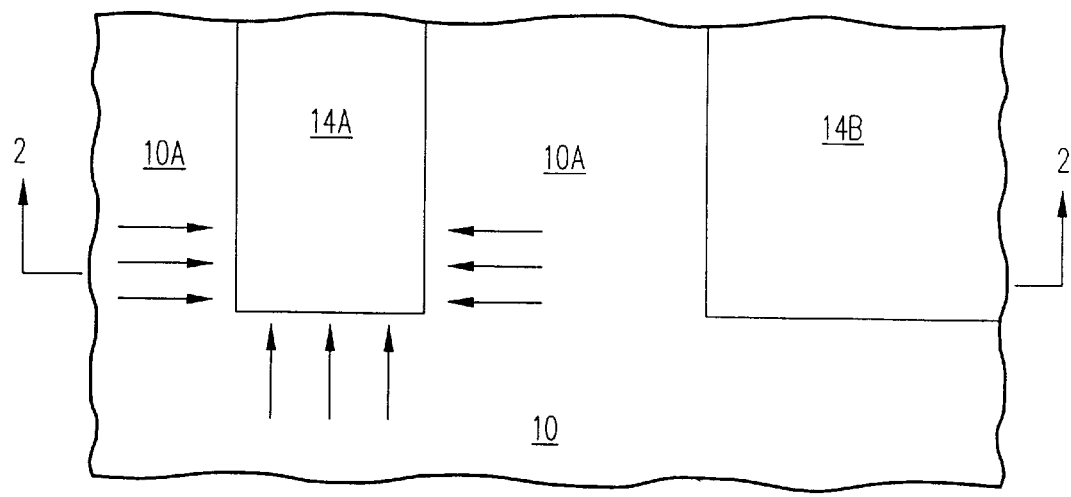
FIGS. 1–3 show a typical prior art method for growing field oxide.
Figure 2:
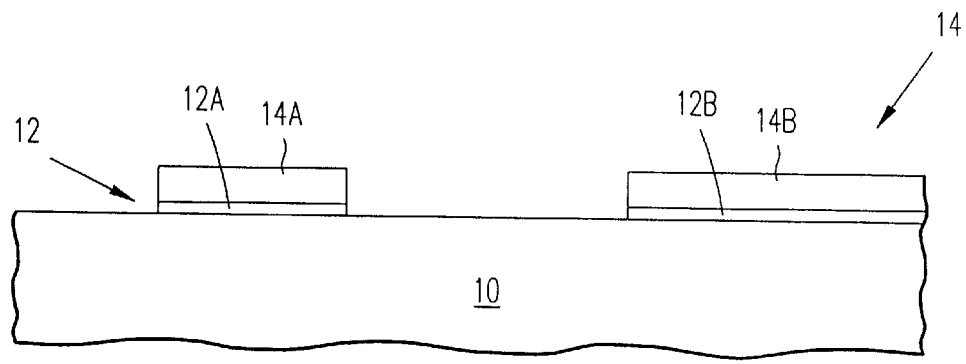
Figure 3:
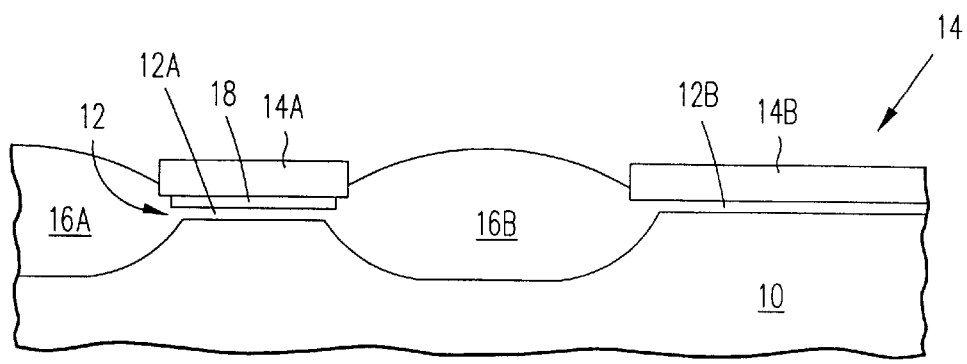
Figure 4:
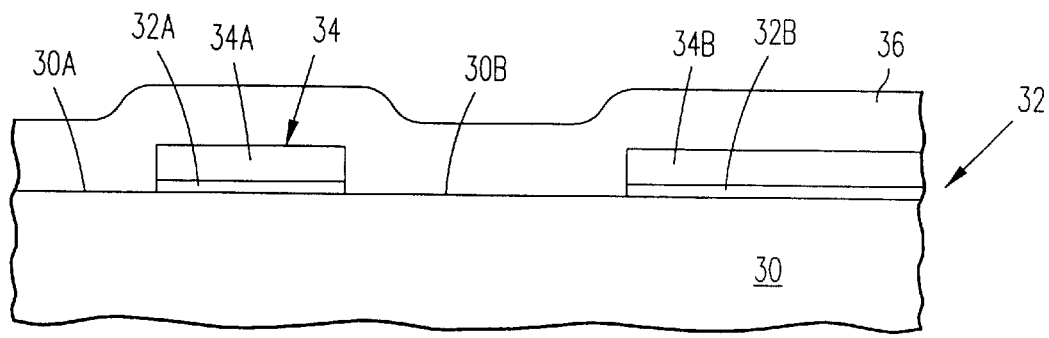
FIGS. 4–8 show the present method for growing field oxide.

As shown in FIG. 4, a silicon substrate 30 has patterned thereover a pad oxide layer 32 and a nitride layer 34, with the pad oxide layer conforming to the configuration of the nitride layer so that nitride layer portions 34A, 34B overly pad oxide layer portions. At this point, the exposed silicon surface is cleaned using, for example, HF solution, and an RCA-1 cleaner, made up of $H_2O$, $NH_4OH$ and $H_2O_2$ roughly in the ratio of 5:1:1 by volume is used for further cleaning. The exposed silicon areas 30A, 30B are thus completely cleaned of any residual oxide.

Figure 5:
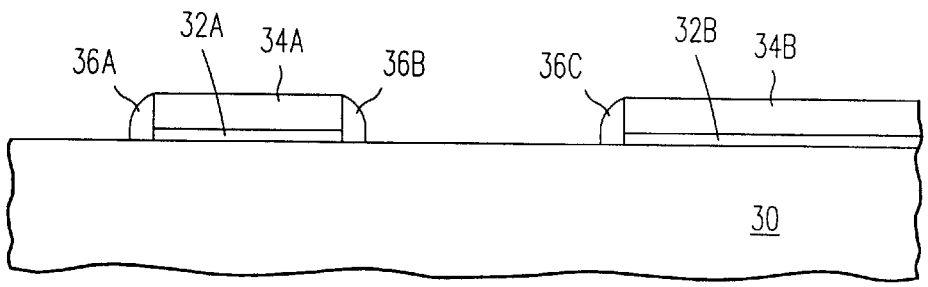

Next, a layer of polysilicon 36 is deposited over the resulting structure. Anisotropic silicon etch is undertaken using Reactive Ion Etch (RIE). This results in polysilicon shoulders or spacers 36A, 36B, 36C being formed on opposite sides of the nitride layer portion 34A and the side of the nitride layer portion 34B, and in contact with the silicon substrate 30. FIG. 5 shows an intermediate step of such etching, which etching is continued into the silicon substrate 30 as shown in FIG. 6, so that the surface of the substrate 30 is recessed, meanwhile with the spacers 36A, 36B, 36C being further etched into smaller configuration as shown at 36A', 36B', 36C' in FIG. 6.

Then, field oxide 38A, 38B is grown at high temperature, for example, 1000°–1300° C. During such oxidation, the polysilicon spacers 36A', 36B', 36C' are oxidized, as are the exposed silicon substrate areas. This operation continues until the field oxide regions 38A, 38B are grown, as shown in FIG. 6, wherein each entire spacer is oxidized and a portion of the silicon of the substrate 30 is oxidized (the dotted lines indicate the previous positioning of the spacers and the previous surface of the silicon substrate).

It will be noted that at the beginning of growth of the field oxide, there is no oxidation occurring underneath the nitride layer portion, 34A, 34B. In fact, the initial oxidation in growing the field oxide is spaced from the sides of the nitride layer portions 34A, 34B. Furthermore, because of the cleaning steps described above, there exists no preferred diffusion path for the oxygen. Thus, the formation of undesirable oxide beneath the edges of the nitride is suppressed.

Figure 6:
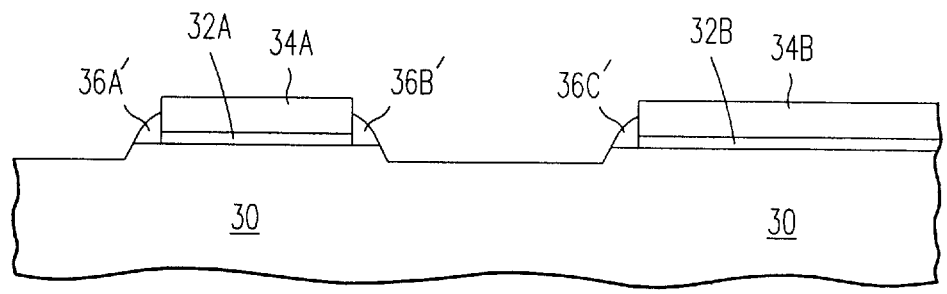
Figure 7:
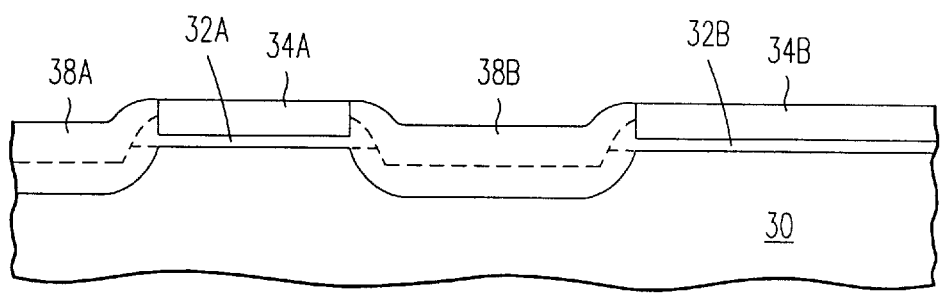
Figure 8:
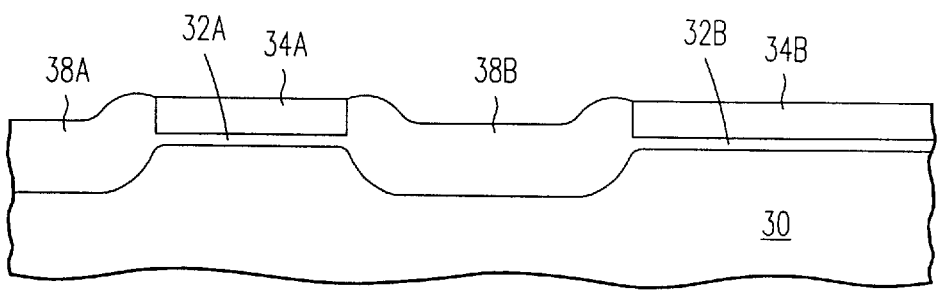

In order to insure that all of the polysilicon of the spacers is consumed and converted into oxide, the height of each spacer as shown in FIG. 6 is chosen to be slightly less than ½ the final field oxide thickness. In addition, the process of growing field oxide can be continued to grow a small portion of oxide underneath the nitride layer portions 34A, 34B, so as to avoid any device anomalies. This configuration is shown in FIG. 8.

By beginning field oxidation at points which are removed from rather than adjacent the edges of the nitride layer portions 34A, 34B, because of minimal encroachment of growing oxide under the edges of the nitride layer portions, lifting force applied to the nitride layer portions 34A, 34B is reduced as compared to the prior art.

In using this method, a line width of a nitride layer portion 34A of substantially less then 0.5 microns can be used.

While encroachment in a typical prior art device as thus described may be on the order of 0.125 microns, this may be readily reduced to ≦0.100 microns in using the present method. Because the amount of encroachment is reduced significantly, the lifting force applied to the nitride is substantially reduced, so that in turn required nitride thickness can be reduced significantly. For example, a nitride thickness of 1000 Å is sufficient, and may in certain situations be reduced to 800 Å.

Then, excess oxide may be removed by chemical mechanical polishing, after depositing of a layer of material to planarize to an extent the upper surface. Alternatively, a layer of photoresist or spin-on-glass (SOG) can be applied and then plasma etched. When such an etch is undertaken, the nitride protects the active areas of the silicon body.

We claim:

1. A method of fabricating a semiconductor device comprising:

providing a silicon body;

providing a patterned nitride layer over said silicon body, said patterned nitride layer exposing a portion of said silicon body;

providing an oxidizable material over said patterned nitride layer and said portion of said silicon body;

anisotropically etching said oxidizable material to form a spacer of said oxidizable material at the periphery of said patterned nitride layer and into said portion of said silicon body; and growing a field oxide in an area spaced from said patterned nitride layer by said spacer, said field oxide having a thickness greater than twice the thickness of said spacer.

2. The method of claim 1 and further comprising the step of completely oxidizing the oxidizable material during growth of the field oxide.

3. The method of claim 1 and further comprising the step of providing that the oxidizable material is polysilicon or amorphous silicon film.

4. A method of fabricating a semiconductor device comprising:

providing a silicon body;

providing an oxide layer over the silicon body;

providing a patterned nitride layer over the oxide layer;

patterning the oxide layer to conform to the patterned nitride layer, thereby exposing a portion of said silicon body;

providing a layer of oxidizable material over the resulting structure to conform thereto;

anisotropically etching the oxidizable material to provide a spacer at the periphery of said patterned nitride layer in said exposed portion of said silicon body and into said exposed portion of said silicon body; and growing a field oxide in an area spaced from the side of the portion of the nitride layer, said field oxide having a thickness greater than twice the thickness of said spacer.

5. The method of claim 4 wherein the oxidizable material is completely oxidized during growth of the field oxide.

6. The method of claim 5 and further comprising the step of providing the oxidizable material as polysilicon.

* * * * *